United States Patent [19]

Schertz et al.

[11] 4,029,519

[45] June 14, 1977

[54] SOLAR COLLECTOR HAVING A SOLID TRANSMISSION MEDIUM

[75] Inventors: William W. Schertz, Batavia; Solomon Zwerdling, Woodridge, both of Ill.

[73] Assignee: The United States of America as represented by the United States Energy Research and Development Administration, Washington, D.C.

[22] Filed: Mar. 19, 1976

[21] Appl. No.: 668,345

[52] U.S. Cl. .................... 136/89 PC; 126/270; 126/271; 136/206; 350/96 R
[51] Int. Cl.² ................ H01L 31/04; H01L 35/00
[58] Field of Search ............ 136/89, 206; 126/270, 126/271; 350/293, 96 R

[56] References Cited
UNITED STATES PATENTS

| | | | |
|---|---|---|---|
| 3,218,924 | 11/1965 | Miller | 88/28.93 |
| 3,229,682 | 1/1966 | Perlmutter et al. | 126/270 |
| 3,310,439 | 3/1967 | Seney | 136/89 |
| 3,379,394 | 4/1968 | Bialy | 244/1 |
| 3,427,200 | 2/1969 | Lapin et al. | 136/89 |
| 3,675,552 | 7/1972 | Papke | 95/11 V |
| 3,780,722 | 12/1973 | Swet | 126/270 |
| 3,924,954 | 12/1975 | Decret | 356/188 |

*Primary Examiner*—John H. Mack
*Assistant Examiner*—Aaron Weisstuch
*Attorney, Agent, or Firm*—Dean E. Carlson; Arthur A. Churm; Paul A. Gottlieb

[57] ABSTRACT

There is provided a radiant energy transmission device capable of operation in a concentrative mode in which energy incident on an entrance area is directed toward and concentrated on an exit area of smaller area than the entrance area. The device includes a solid radiant energy transmission medium having surfaces coincident with the entrance and exit areas and particularly contoured reflective side walls. The surface coinciding with the entrance area is coupled to a cover plate formed of a radiant energy transmissive material. An energy transducer is coupled to the surface of the medium coinciding with the exit area.

10 Claims, 5 Drawing Figures

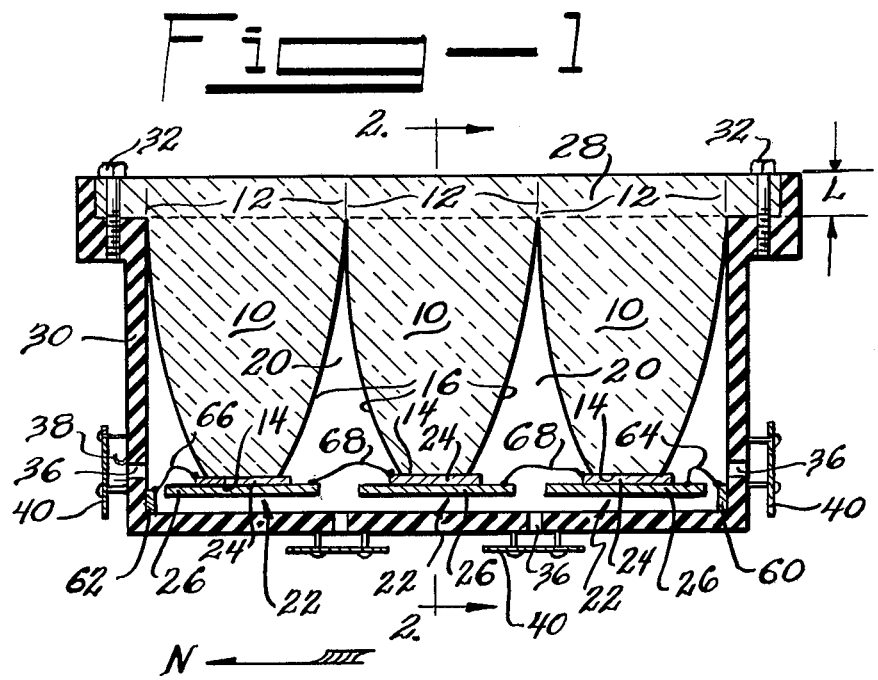
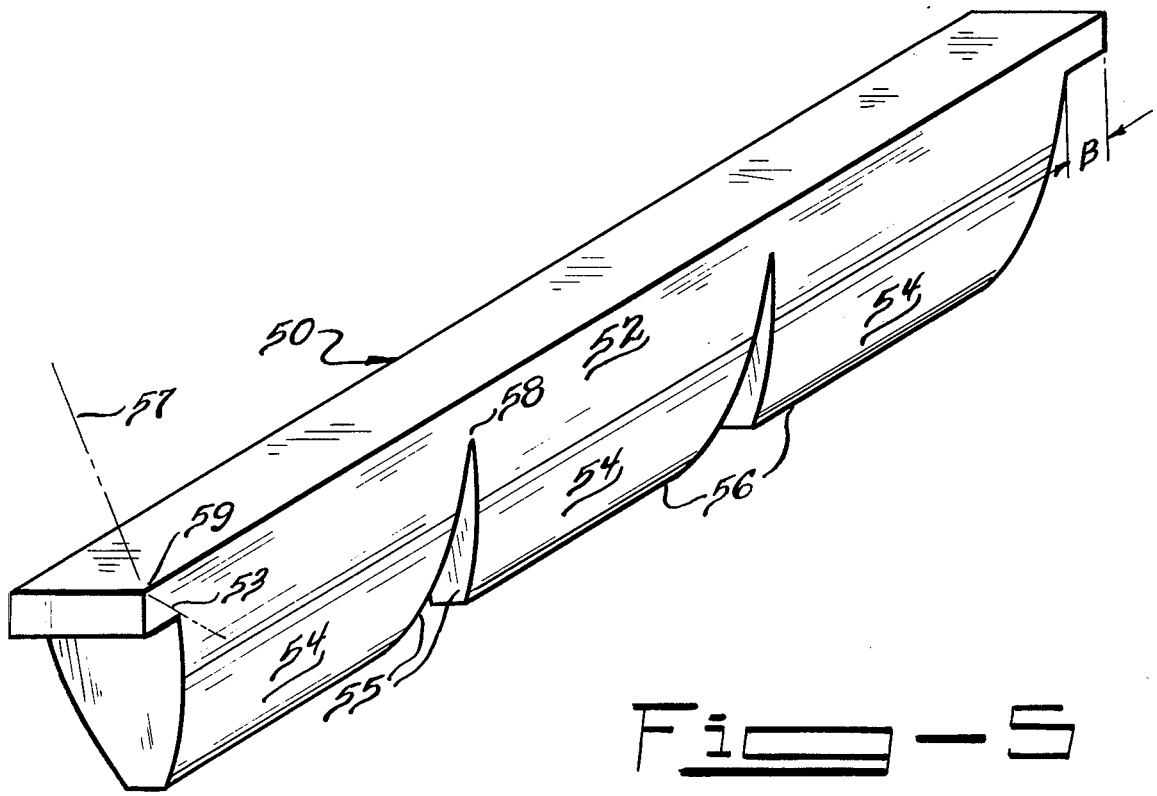

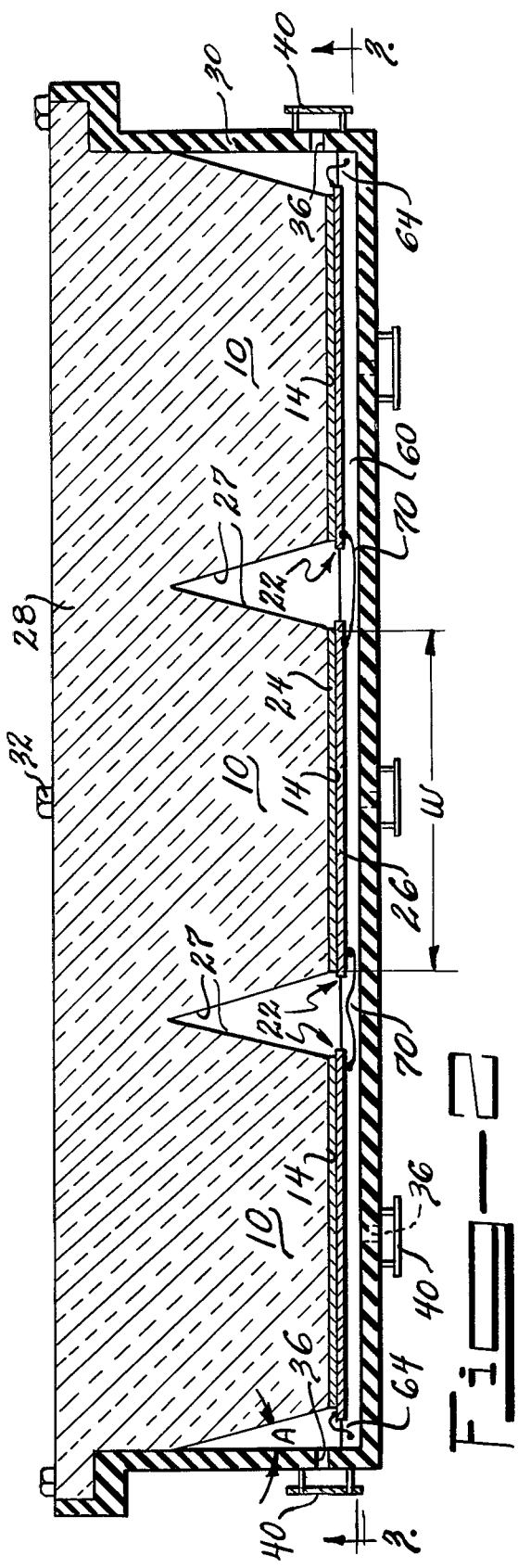

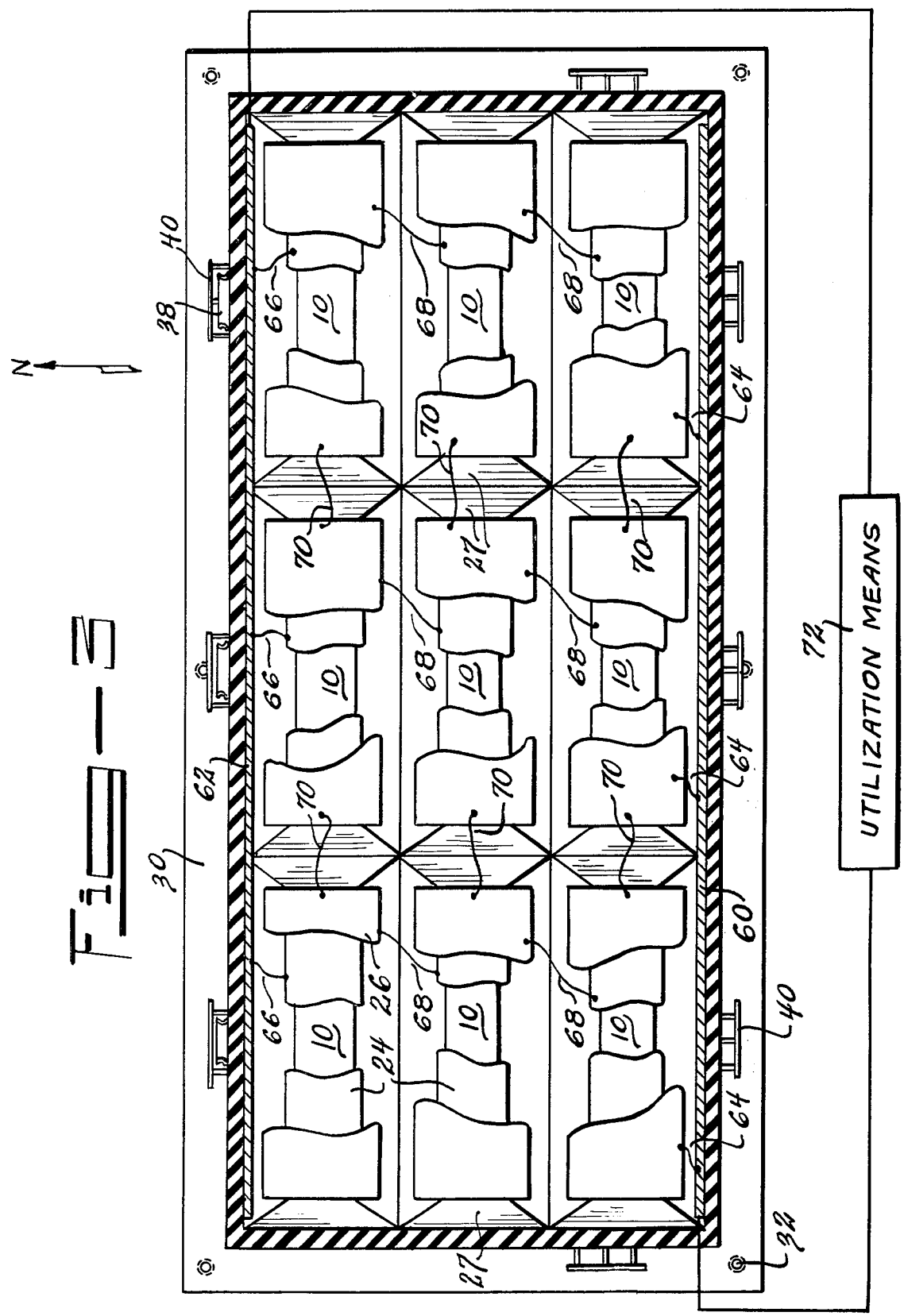

4,029,519

SOLAR COLLECTOR HAVING A SOLID TRANSMISSION MEDIUM

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

The present invention relates generally to radiant energy transmission devices and, in particular, to transmission devices having opposing reflective side walls operable in a concentrative mode whereby energy incident on an entrance area is directed to and concentrated on an exit area. In a publication, *Solar Energy*, Vol. 16, No. 2, pages 89–95 (1974), in a publication *Solar Energy Concentration, Progress Report* NSF/RANN AER 75-01065 (February 1975), in a U.S. Pat. No. 3,923,381 of Winston and in prior application Ser. No. 581,613 filed May 29, 1975, there are described techniques for generating the ideal side wall contours for such a collector or transmission device. In a subsequent publication, *Applied Optics*, Vol. 15, No. 2, pages 291–292, February 1976, there is a described the application of the principles disclosed in the above art relating to ideal reflective side wall contour to transmitting and guiding surfaces at the interface of media of differing indices of refraction for radiant energy. To the extent these items contain "essential material" necessary to support the claims hereof or indicate background, they are expressly incorporated by reference herein.

Devices employing these principles include solid dielectric medium. By solid dielectric medium is meant an optically clear material having an index of refraction at least greater than one. Such media are particularly suited for application with photovoltaic cells and ideally are configured according to principles contained in the publication *Applied Optics* referred to above. The cells would be positioned at the exit aperture or exit area of the solid medium. The prior art practice has been to bond the cell to the exit area and then bond the cell to a base for the structural support of the assembly of cell and medium. Since the bulk of the solid dielectric transmission medium is closer to the entrance area and since the exit area, which is the coupled surface through which structural support is provided, is very small compared to the entrance area, only a very slight force is sufficient to break the bond at the exit area end of the assembly, making the assembly of cell and medium very fragile. Further, the differential rates of heat expansion between the medium and the cell contributes to the instability of the prior art technique.

It is therefore an object of this invention to provide an improved radiant energy direction device.

Another object of this invention is to provide an improved radiant energy concentration and collection device.

Another object of this invention is to provide a structurally improved solar collector having a solid transmission medium and a cover plate.

SUMMARY OF THE INVENTION

For a radiant energy direction device, having a radiant energy transmitting medium defining opposing reflective surfaces capable of concentrating energy incident at an entrance area thereof onto an exit area thereof of smaller area than the entrance area, an improved assembly is provided. The entrance area of the medium is coupled to a cover plate. A plurality of such media may be coupled to a cover plate to form an array for a wider area of collection or transmission. An energy transducer is coupled to the exit area of each medium. With mounting of the cover plate on a housing, the energy transducers are suspended, i.e. floating, uncoupled to the housing to allow any differential heat expansion of the medium and the transducer. Coupling of the medium to the cover plate can be facilitated in a variety of manners such as by coupling the medium to a cover plate, forming an integral unit including the cover plate and the medium and various related techniques.

BRIEF DESCRIPTION OF THE DRAWINGS

FIG. 1 is a cross section of one embodiment of the invention;

FIG. 2 is a section through line 2 — 2 of FIG. 1;

FIG. 3 is a section through line 3 — 3 of FIG. 2;

FIG. 4 is an alternate embodiment of the assembly of medium and cover plate; and FIG. 5 is another alternate embodiment of the assembly of medium and cover plate.

DETAILED DESCRIPTION OF THE PREFERRED EMBODIMENT

Referring to FIG. 1, FIG. 2, and FIG. 3 there is shown a device for transmitting radiant energy which in the embodiment shown is ideally suited for the concentration and collection of radiant energy. For such a device utilized as a solar energy collector, the cross section of FIG. 1 lies in the north-south plane, while the cross section of FIG. 2 would lie in the east-west plane. The device utilizes a plurality of solid radiant energy transmission media 10 to direct radiant energy incident at an entrance area 12 to an exit area 14, where area 12 is larger than area 14. Walls 16 of each medium 10 are of such cross section in the north-south plane, as shown in FIG. 1, and the index of refraction of each medium 10 with respect to the external bordering medium 20 is of such value that walls 16 operate as energy reflecting and guiding walls. With the appropriate index of refraction such a medium can be designed to have total internal reflection although such is not required to practice the invention herein disclosed. The ideal cross sections are described in the published art previously referred to, such as that in *Solar Energy* and the issued patent to Winston and the application of the ideal wall contour to solid transmission medium is described in the publication in *Applied Optics* previously referred to. In the *Applied Optics* publication the conditions for making the medium totally internally reflective of rays incident within a given acceptance angle are determined. The medium could also function ideally with the side walls coated with a reflective material. This disclosure is applicable to either case.

In the embodiment shown, the cross section is extended parallel to an axis perpendicular to the plane of the cross section to form a trough-shaped structure comprised of the solid dielectric. The cross section can also be rotated about an axis to form cone-shaped, solid transmission medium. In any event, the media 10 are normally provided with an energy transducer 22 positioned at exit aperture 14 for the generation of or the absorption of radiant energy. For solar collectors such a transducer would be an energy receiver, a device which absorbs energy incident thereon. Energy receivers can have a variety of cross sections. For each cross section there is a particular preferred contour for side walls 16. In the embodiment shown in FIGS. 1 through 3, the receiver 22 is planar and extends along and is coincident with area 14. Such a planar receiver might be a photovoltaic cell which includes a cell portion 24 responsive to incident energy to develop a voltage thereacross and a heat sink portion 26 in electrical contact with cell portion 24 for dissipating heat developed by cell 24. The length W of the exit area of each medium is tailored to the length of the cells. The cross section in the east-west plane of end walls 27 of each medium 10, can have a variety of shapes. These may either be a straight line end wall, a curved end wall, or a combination of curved and straight line end wall. Cell portion 24 would normally be a semiconductor such as being primarily of silicon, while sink 26 is preferably a good heat conductor having a rate of heat expansion similar to silocon such as copper or steel or Kovar or combinations thereof. Heat sink portion 26 is soldered to cell portion 24 which, in turn, is coupled to medium 10. The coupling of cell portion 24 to medium 10 should allow for the transmission of radiant energy through the coupling. An optically clear epoxy, which is compatible with the material forming cell portion 24, is satisfactory.

In the prior art, transducer 22 was bonded to a base which provided the structural support for the assembly of transducer and medium. The base was then properly oriented so that medium 10 was directed as desired. Since the area 14 is ideally much smaller than the area 12 to give a large concentration factor, e.g. for use with photovoltaic cells a ratio of entrance area to exit area of 10 to 1 is common, by providing structural support through exit area 14 of medium 10, the resultant assembly is very fragile. Because of the narrow support area of the exit area 14 and the bulk of the assembly being closer to entrance area 12, the slightest force applied near area 12 would damage and break the bonding between exit area 14 and cell 22. Because of the difference in rates of heat expansion of the materials of medium 10 and the material of cell 24, further structural difficulties arise with the assembly. Accordingly, there is herein described an improved assembly of these elements having greater structural stability.

A cover plate 28, preferably of the same material as medium 10 and of uniform thickness L, is coupled to medium 10. The cover plate, if separate can also be made of a material having greater ultraviolet absorption and resistance than the material of medium 10, in order to further protect medium 10 from degradation due to the energetic ultraviolet solar photons. As shown in FIG. 1 and FIG. 2, cover plate 28 is coupled to medium 10 by being fabricated as an integral unit with medium 10 to form a homogeneous element. As shown in FIG. 4 cover plate 44 may be coupled to media 46 by having separate elements 46 mounted on plate 44 such as by glue. Plate 28 is coupled to housing 30 such as by means of screws 32, with housing 30 completely enclosing the array of media 10. Cover plate 28 serves several purposes. First, it allows radiant energy to pass through it to medium 10 where it is directed to receiver 22 while at the same time protecting the medium 10 and receiver 22 from environmental factors such as wind, rain, etc. Secondly, as the media 10 are coupled at entrance area 12 to plate 28, great structural support is provided for the assembly. Since the entrance area is usually much greater than the exit area, there is a greater surface area available for coupling of the media 10 to a support means. To allow for differential heat expansion of media 10 and transducers 22, transducers 22 are not coupled to housing 30, but rather float in the external medium 20 which would normally be air. Thus, plate 28 by being coupled to medium 10 and housing 30 suspends the array of media 10 in the air. Holes 36 are provided in housing 30 to allow air or other coolant fluid to circulate about transducers 22 to allow for the removal of heat dissipated therefrom.

Since the device would normally be tilted so that the north end is higher than the south, natural convection will force air through the unit. Of course, artificial means for forcing coolant through the unit may also be provided. Gutter 38 for the raised north end is provided to prevent rain from entering the hole 36 at the north end. Hole covers 40 for each hole 36 prevent rain and other splashed material from entering housing 30. In the embodiment of FIGS. 1 through 3, media 10 are integral with plate 28. This assembly lends itself to mass production since plastics may be utilized as media 10. For example, the integral unit of media 10 and cover plate 28 can be formed by injection molding. Acrylic is an ideal material for media 10 and plate 28 and for injection molding. In the embodiment of FIG. 4 where cover plate 44 is separate from each medium 46, each medium 46 may be glued to plate 44 to provide the necessary structural coupling. Here again an optically clear epoxy would be satisfactory to allow radiant energy to pass through the coupling. A further embodiment is illustrated in FIG. 5, where rows of elements 50 have a cover plate section 52 and mediums 54 which are uniformly made. These rows of elements may be glued together to form the desired array. In FIG. 5, the cross section of the row corresponds to the cross section as described for FIG. 1. Of course, such a row could correspond to the cross section as described for FIG. 2.

With each side wall 16 of ideal contour as described in the reference publications the maximum concentration factor for a trough shaped device is very nearly attained. On the other hand, the contribution of the contour of end wall 27 to concentration is small. As the angle of acceptance for each end wall is necessarily very large a remedial prescription from the ideal contour described in the Applied Optics publication is required. Such a prescription for a flat receiver involves combinations of curves and/or straight portions which extend from the exit area to the cover plate. This is shown in FIG. 5 where the end walls 55 extend from the exit area 56 all the way to the bottom of cover plate 52 at points 58. Since the end walls make such a small contribution to overall concentration and since extending such end walls all the way to the cover plate increases fabrication costs, it may be desirable to vary end wall contour from the ideal. For example, in FIG. 2 the cross section of each end wall 27 is a straight line so that a V trough is formed between adjacent end walls. Further, the V trough end walls do not extend all the way to the bottom of the cover plate 28. By shortening the end wall, fabrication costs are reduced. There exists an angle A that each straight end wall 27 makes with the vertical which will maximize the concentration factor of such a straight end wall. A is determined by the following equation:

$$A = 90° - 2/\sin(1/n)$$

where $n$ is the index of refraction of the medium.

There also exists an edge effect associated with the cover plate. This can be seen in FIG. 5 where the overhang of cover plate 52 is of dimension B. For maximal concentration, factor B should be large enough so that ray 57, incident at the extreme edge 59 of cover plate 52 and which is refracted along a path 53 determined by the index of refraction of the medium of cover plate 52, should enter the concentration element 54. If B is too short, some rays which could be refracted by the overhang into medium 54 would not be so refracted.

When the device is used as a solar concentration device and the transducer is to be a photovoltaic cell, as illustrated in FIGS. 1 through 3, bus bars 60 and 62 are provided. Bus bar 60 is coupled by leads 64 to heat sinks 26 in the row of the array adjacent bus bar 60. Bus bar 62 is coupled by leads 66 to cell portions 24 in the row of the array adjacent to bus bar 62. In rows perpendicular to these rows all heat sinks are coupled by leads 68 to adjacent cell portions, while in the rows parallel all heat sinks are coupled to the adjacent heat sinks by leads 70. The bus bars are coupled to utilization means 72 which is capable of utilizing the d.c. voltage thereby developed. The advantage of the electrical connection shown is that if one of the photo cells fail, there will only be a decrease in current rather than a decrease in voltage.

It is to be understood the disclosed assembly of elements is not limited to trough shaped media, to media with ideal side wall contour, to media having total internal reflection, or to flat photovoltaic cell receivers. The assembly can be utilized with heat absorbing receivers which remove the heat absorbed such as heat pipes or with transducers which generate energy.

The embodiments of the invention in which an exclusive property or privilege is claimed are defined as follows:

1. A radiant energy direction device capable of operating in the concentrative mode where energy incident on a planar entrance area thereof is directed to an exit area thereof, comprising: a solid radiant energy transmission medium having surfaces coincident with said entrance and exit areas with the surface coincident with said entrance area of larger area than the surface coincident with said exit area, a cover plate formed of a solid radiant energy transmission medium to which the surface of said medium coincident with said entrance area is coupled a radiant energy transducer coupled to the surface of said medium coincident with said exit area, and a housing upon which said cover plate is mounted such that said transducer and said medium are suspended to allow for differential heat expansion therebetween.

2. The device of claim 1 wherein said cover plate is of the same material as said medium, said cover plate being coupled to said medium in such manner that said cover plate and said medium are formed as an integral unit.

3. The device of claim 2 wherein the transverse cross section of said medium includes opposing side walls extending between said exit and entrance areas and wherein said transverse cross section of said medium is extended along an axis perpendicular to said transverse cross section to form a trough shaped structure.

4. The device of claim 3 wherein said exit surface is planar and wherein said radiant energy transducer is a radiant energy receiver having a flat surface and positioned so that said flat surface coincides with said exit area.

5. The device of claim 4 wherein said trough shaped medium includes end walls extending between said side walls, said end walls each having a cross section in the form of a straight line extending from said exit area away from the opposing end wall at an angle A with respect to a perpendicular to said exit area, angle $A = 90° - 2/\sin(1/n)$ with $n$ being the index of refraction of the material of said medium.

6. The device of claim 5 further including a plurality of said trough shaped media having planar exit areas and with radiant energy receivers coupled thereto, all of said media being of the same material as said cover plate and being coupled to said cover plate in such manner that said cover plate and said media are formed as an integral unit.

7. The device of claim 6 wherein said integral unit of cover plate and media is formed as a row of media all symmetric about an axis, and wherein said device further includes at least one other integral unit of cover plate and media formed as a row, with said integral units glued together with an optically clear glue.

8. The device of claim 6 wherein said housing is in the form of an enclosure surrounding a chamber with said cover plate forming one side of said enclosure and there being holes in said enclosure to allow air to pass from outside said housing to said chamber, said cover plate being mounted on said housing such that said media and said radiant energy receivers coupled thereto are suspended within said chamber without contacting said housing.

9. The device of claim 8 wherein said radiant energy receivers are photovoltaic cells.

10. The device of claim 9 further including electrical connections coupled to said cells.

* * * * *